United States Patent [19]

Lou

[11] Patent Number: 4,841,252
[45] Date of Patent: Jun. 20, 1989

[54] SYSTEM FOR COMPENSATING FOR OFFSET VOLTAGES IN COMPARATORS

[75] Inventor: Perry W. Lou, Carlsbad, Calif.

[73] Assignee: Brooktree Corporation, San Diego, Calif.

[21] Appl. No.: 81,910

[22] Filed: Aug. 5, 1987

[51] Int. Cl.[4] .............................................. H03F 1/02
[52] U.S. Cl. ........................................ 330/9; 330/151
[58] Field of Search ................... 330/9, 151, 252, 261

[56] References Cited

U.S. PATENT DOCUMENTS 4,749,953   6/1988   Gulczynski ............................. 330/9

FOREIGN PATENT DOCUMENTS 0150606   8/1985   European Pat. Off. ................ 330/9

Primary Examiner—Gene Wan
Attorney, Agent, or Firm—Ellsworth R. Roston; Charles H. Schwartz

[57] ABSTRACT

A variable input voltage is periodically introduced in first time periods to an amplifier such as a differential amplifier to obtain an output from the amplifier. The amplifier may receive a reference voltage at one input terminal and the input voltage at a second input terminal in the first time periods. The input to the amplifier is periodically shorted in second time periods alternating with the first time periods so that the reference voltage is applied to both input terminals. Any offset voltage from the amplifier in the second time period may be converted to a binary signal to indicate the polarity of the offset voltage. The binary signal may be introduced to a storage member such as a capacitance. The capacitance accumulates energy in accordance with the characteristics of the binary signal in successive ones of the second time periods. The energy in the capacitance is introduced to the output terminals of the amplifier in a direction to compensate for the offset voltage in the amplifier. First switches may prevent the energy in the capacitance from being introduced to the output terminals of the amplifier during the second time periods. Second switches may prevent the capacitance from being charged by the output from the amplifier during the first time periods.

30 Claims, 2 Drawing Sheets

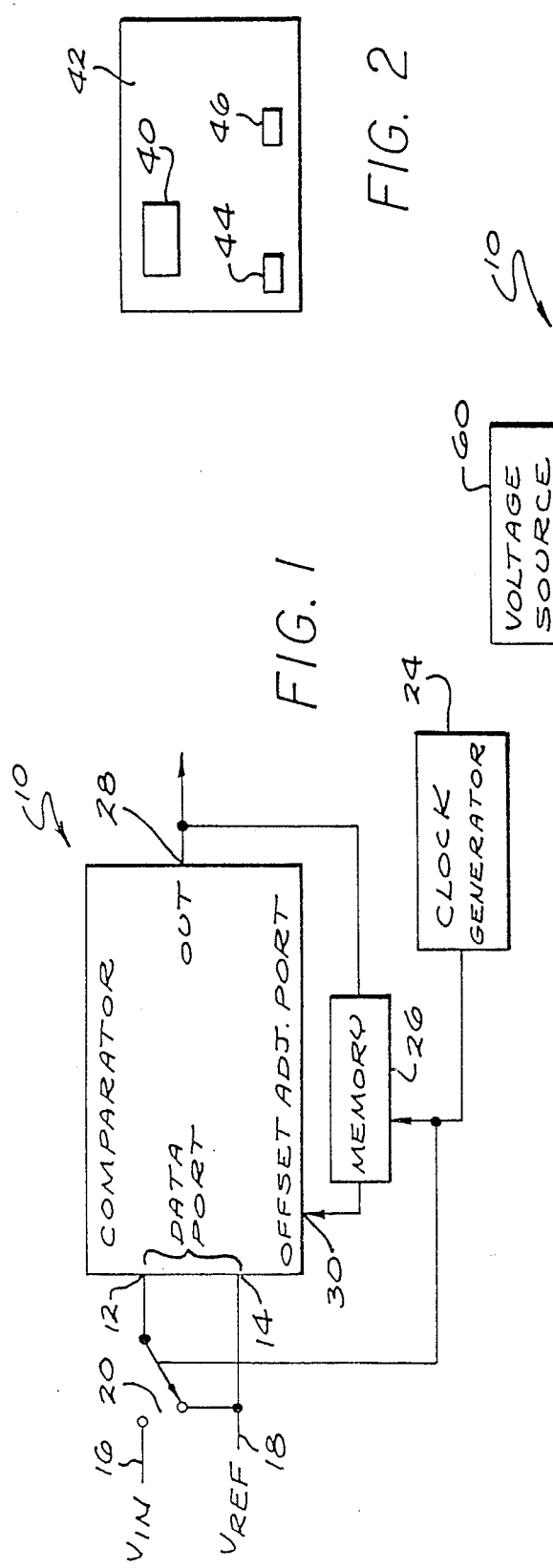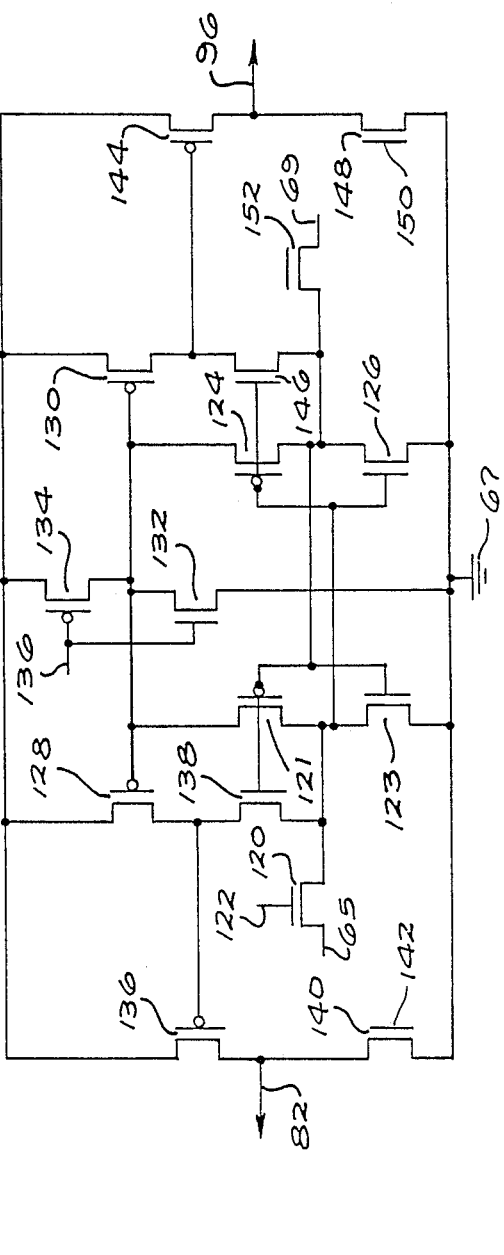
FIG. 1
FIG. 2
FIG. 4

SYSTEM FOR COMPENSATING FOR OFFSET VOLTAGES IN COMPARATORS

This invention relates to comparators for indicating the difference between the characteristics of two input signals.

More particularly, the invention relates to a system for use with a comparator to compensate for the offset voltages produced in the comparator. The invention also has applicability to amplifiers such as differential amplifiers.

As data processing systems become increasingly refined in construction and operation, they are progressively able to operate at higher speeds, and are able to process data with greater accuracies, than they have been previously able to do. For example, data processing systems are now able to process data at a rate of millions of binary bits per second. Furthermore, the data processing systems now operate at thirty two (32) bits per word instead of the sixteen (16) bits per word commonly used previously thereby increasing the accuracy of the processing information.

As the data processing systems have increased in speed and accuracy, it has become increasingly important that the different stages used in association with the data processing systems also become progressively improved in their speed and accuracy of response. As will be appreciated, it is of no benefit to a user if the processing of digital data becomes improved without corresponding improvements in the accuracy of response of the analog components and sub-systems which provide the data upon which the digital processing is based.

Comparators are among the key components and sub-assemblies often used in data processing system. A comparator generally compares a variable input voltage with a reference voltage and produces a difference (or error) voltage having characteristics dependent upon the results of the comparison. This difference voltage is generally in analog form. The difference voltage is then converted into digital form and is introduced in digital form to the data processing system for processing with other information in, or introduced to, the data processing system.

The data processing system may then process the information represented by the difference voltage in digital form and may simultaneously process other data in conjunction with the processing of the difference signal in digital form. The data processing system may then generate control signals in digital form. These control signals may be introduced to components in the system to modify the operation of these components. The modified operation of these components may change the values of parameters in a direction to reduce or minimize the difference signal from the comparator.

As will be appreciated, the comparators in the data processing systems should be able to operate at high speeds with minimal errors to match the speed and accuracy of the data processing systems. However, the comparators generally provide an offset voltage which affects the accuracy of response of the comparators. This offset voltage represents the error in the operation of the comparator when the input terminals to the comparator receive identical voltages. The magnitudes of the offset voltages in the comparators are often significant in relation to the magnitudes of the input voltages to the comparators. These offset voltages accordingly cause significant errors to be generated sometimes by the comparators in the production of the difference voltage when the comparators compare the input and reference voltages.

Various attempts have been made to compensate for the offset errors in comparators. For example, capacitors have been provided at the inputs to the comparators to store charges in the capacitors to compensate for the offset voltages. Although the offset voltages have been at least partially compensated by such input capacitors, the speed of response of the comparators has been considerably delayed. This has resulted from the need to charge the comparators in accordance with the offset voltage and to prevent any meaningful measurement of the difference between the characteristics of the input and reference voltages from being made while such charging is occurring. Because of this, the speed of response of the comparators has been effectively reduced by one half ($\frac{1}{2}$) in relation to the speed of response of the comparators when no compensation for the offset voltage is being made.

Attempts have also been made to provide capacitors in the output of the comparators. In this arrangement, a latch arrangement is provided at the output from the amplifier to receive the variable signals flowing through the capacitors from the output of the comparator. This arrangement suffers the same disadvantages as discussed in the previous paragraph since it reduces the speed of response of the comparator by approximately one half ($\frac{1}{2}$). It also reduces the accuracy of response of the comparator below that otherwise expected because the gain of the amplifier constituting the comparator reduces the bandwidth of the system including the amplifier.

As will be seen, both of the prior art systems discussed above operate on an open-loop basis. Furthermore, both of the prior art systems alternately determine offset voltages and then determine the difference between the characteristics of the input and reference voltages while providing a compensation for the offset voltage in accordance with the previous determination of such offset voltage. Such an alternate determination of offset and error voltages in the comparator significantly reduce the frequency at which the difference between the characteristics of the input and reference signals can be determined.

The limitations in the compensating systems of the prior art have been known for some time. Considerable efforts have been made, and significant amounts of money have been expended, to provide a system which will be fast and accurate to match the speed and accuracy of the associated data processing system and which will compensate for the offset error in a comparator. In spite of such considerable effort and such significant expenditures of money, a satisfactory system for compensating for offset voltages in comparators has still not been provided.

This invention provides a system for overcoming the above disadvantages. The system is fast and accurate. For example, it determines the offset error of a comparator during each horizontal retrace in a raster scan of an image and uses such determination to compensate for the offset voltage in the comparator during the next scanning of a horizontal line in the image. The system also operates on a closed loop basis during each horizontal retrace to determine the offset voltage in the comparator.

In one embodiment of the invention, a variable input voltage is periodically introduced in first time periods to an amplifier such as a differential amplifier to obtain an output from the amplifier. The amplifier may receive a reference voltage at one input terminal and the input voltage at a second input terminal in the first time periods. The input to the amplifier is periodically shorted in second time periods alternating with the first time periods so that the reference voltage is applied to the input terminals.

Any offset voltage from the amplifier in the second time period may be converted to a binary signal to indicate the polarity of the offset voltage. The binary signal may be introduced to a storage member such as a capacitance. The capacitance accumulates energy in accordance with the characteristics of the binary signal in successive ones of the second time periods. The energy in the capacitance is introduced to the output terminals of the amplifier in a direction to compensate for the offset voltage in the amplifier.

First switches may prevent the energy in the capacitance from being introduced to the output terminals of the amplifier during the second time periods. Second switches different from the first switches may also prevent the capacitance from being charged by the output from the amplifier during the first time periods.

In the drawings:

FIG. 1 is a schematic block diagram illustrating one embodiment of the invention for compensating for offset voltages in the output of a comparator;

FIG. 2 is a schematic block diagram illustrating the operation of the invention shown in FIG. 1 in a system for recreating an image on a screen;

FIG. 4 is a detailed circuit diagram of another portion of the embodiment shown in FIG. 1.

Figure 3:
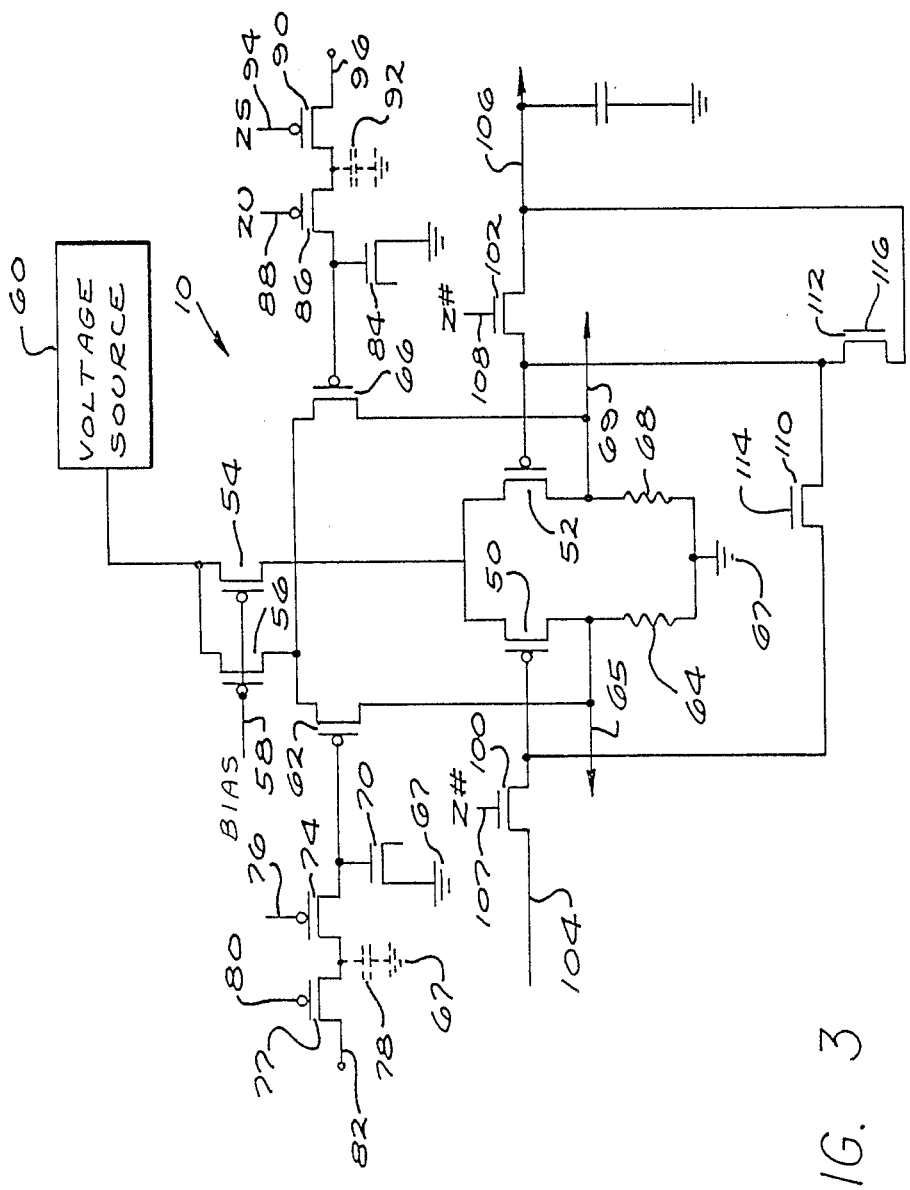
FIG. 3 is a detailed circuit diagram of a portion of the embodiment shown in FIG. 1.

In the embodiment shown in FIG. 1, a comparator generally indicated at 10 is shown in block form. The comparator 10 has input terminals 12 and 14. In the normal mode of operation, an input voltage on a line 16 is applied to the input terminal 12 and a reference voltage such as (but not necessarily) ground on a line 18 is applied to the input terminal 14. The input voltage on the line 16 may be variable at progressive instants of time.

A single-pole double-throw switch 20 having two stationary contacts and a movable arm is included in the embodiment shown in FIG. 1. The stationary contacts of the switch 20 respectively receive the voltages on the lines 16 and 18. The movable arm of the switch 20 is connected to the input terminal 12. The movable arm of the switch 20 also receives clock signals from a clock generator 24. The clock signals from the clock generator 24 are also introduced to a terminal of a memory 26. The memory 26 receives signals from an output 28 of the comparator 10. The output from the memory 26 is introduced to an offset adjustment port 30 in the comparator 10.

In the normal mode of operation of the comparator 10, the movable arm of the switch 20 is connected to the upper stationary contact of the switch. This causes the variable input voltage on the line 16 to be introduced to the comparator 10 for comparison with the reference voltage on the line 18. The comparator 10 then determines the difference between the voltages on the lines 16 and 18 and produces on the line 30 a voltage representing this difference. The operation of the comparator 10 is synchronized in accordance with the introduction of clock signals from the clock generator 24. The construction and operation of the differential amplifier portion of the comparator 10 may be standard in the art.

Generally the output from the comparator 10 does not reflect accurately, without any error, the difference between the voltages on the lines 16 and 18. This results from such factors as differences between the actual values and designed values of components in the comparator, changes in the values of such components with changes in temperature and changes in the values of components as a result of aging. The resultant error in the output of the comparator 10 is generally designated as the offset voltage.

The offset voltage in the comparator 10 is determined by moving the movable arm of the switch 20 into engagement with the lower stationary contact of the switch in FIG. 1. When this occurs, the reference voltage is introduced to both of the input terminals 12 and 14. The resultant output from the comparator 10 represents the error inherent in the operation of the comparator. This offset voltage is introduced to the memory 26 for storage. The memory 26 in turn introduces this voltage to the output terminals of the comparator during the time that the movable arm of the switch 20 engages the upper stationary contact of the switch. The offset voltage stored in the memory 26 is introduced to the comparator 10 in a direction to compensate for the error inherent in the operation of the comparator.

The movement of the movable arm of the switch 20 into engagement with the upper and lower stationary contacts of the switch 20 may occur on a periodic basis. Furthermore, the relative time of engagement between the movable arm of the switch 20 and the upper stationary contact of the switch may be considerably greater in each cycle of operation than the relative time of engagement between the movable arm of the switch and the lower stationary contact of the switch.

By way of illustration, the comparator 10 may be included in a system for displaying an image on a video display 40 in a data processing system 42. Specifically, the comparator 40 may be included in a flash converter 44 in such a system for providing a conversion between analog and digital values. Under such circumstances, the movable arm of the switch 20 may engage the upper stationary contact of the switch during each of the horizontal sweeps provided in a beam by a horizontal sweep circuit 46. The movable arm of the switch 20 may engage the lower stationary contact of the switch during each retrace in the beam by the horizontal sweep circuit 46 to initiate the sweep of the next horizontal line in the image. The data processing system 42, the video display 40, the flash converter 44 and the horizontal sweep circuit 46 may be standard in the art.

As will be seen, the relative time for each horizontal retrace is considerably shorter than the time for each horizontal sweep. As a result, each determination of the offset voltage in a horizontal retrace is effective in compensating in the comparator 10 for a relatively long period of time corresponding to the time required to produce the next horizontal sweep. The system of this invention is effective in providing the compensation for the offset voltage during this extended period of time because the offset voltage determined during each horizontal retrace is stored in the memory 26.

FIGS. 3 and 4 show a detailed embodiment of the invention shown in block diagram in FIGS. 1 and 2. As shown in FIG. 3, the comparator 10 may comprise a differential amplifier including transistors 50 and 52, both of which may be of the p type. The sources of the transistors 50 and 52 are connected to the drains of a transistor 54, which may also be of the p-type. The gates of the transistor 54 and of a transistor 56 receive a bias voltage on a line 58. A positive voltage is applied from a source 60 to the sources of the transistor 54 and 56. The transistor 56 may also be of the p-type.

The drain of the transistor 56 is common with the source of a transistor 62 which may be of the p-type. The drain of the transistor 62 is common with the drain of the transistor 50, with one terminal of a resistance 64 and with an output line 65. The second terminal of the resistance 64 may be grounded as at 67. In like manner, a transistor 66, a resistance 68 and an output line 69 form circuitry with the transistor 52 in the same manner as that described in this paragraph for the transistor 62, the resistance 64, the output line 65 and the transistor 50.

The gate of the transistor 62 is connected to one terminal of a relatively large capacitance 70, the other terminal of which may be grounded as at 67. The gate of the transistor 62 is also common with the drain of a transistor 74 which may be of the-p type. The gate of the transistor 74 receives a timing signal on a line 76. The source of the transistor 74, the drain of a transistor 77 and one terminal of a relatively small capacitance 78 are common, the second terminal of the capacitance being grounded as at 67. The gate of the transistor 77 receives on a line 80 a timing signal which is non-overlapping with the timing signal on the line 76. The source of the transistor 77 receives a signal on a line 82 from the circuitry shown in FIG. 4. The transistor 77 may be of the p-type.

In like manner, a relatively large capacitance 84, a transistor 86, a timing line 88, a transistor 90, a relatively small capacitance 92, a timing line 94 and an output line 96 are associated with the transistor 66. This association is the same as that described in the previous paragraph for the capacitance 70, the transistor 74, the timing line 76, the transistor 77, the relatively small capacitance 78, the timing line 80 and the output line 82.

The gates of the transistors 50 and 52 respectively receive signals on the drains of transistors 100 and 102, both of which may be of the n-type. The source of the transistor 100 receives a variable input voltage on a line 104. Similarly, a reference voltage on a line 106 is applied to the source of the transistor 102. The lines 104 and 106 may respectively correspond to the lines 16 and 18 in FIG. 1. Timing signals are simultaneously applied to the gates of the transistors 100 and 102 as at 107 and 108.

The source and drain of a transistor 110 are connected between the gates of the transistors 50 and 52 The drain of the transistor 110 is also common with the source of a transistor 112. The source of the transistor 112 receives the reference voltage on the line 106 when the transistor 102 is conductive. The gates of the transistors 110 and 112 respectively receive timing signals on lines 114 and 116. The transistors 110 and 112 may be of the n-type.

The voltage on the output line 65 in FIG. 3 is introduced to the source of a transistor 120 in FIG. 4. The transistor 120 may be of the n-type. The gate of the transistor 120 receives a signal on a line 122. The drain of the transistor 120 is common with the drain of a transistor 121, the drain of a transistor 123 and the gates of transistors 124 and 126. The transistors 121 and 124 may be of the p-type and the transistors 123 and 126 may be of the n-type. The sources of the transistors 123 and 126 may be grounded. The gates of the transistors 121 and 123 may be common with the drain of the transistor 124 and the drain of the transistor 126.

The sources of the transistors 121 and 124 are connected to the gates of transistors 128 and 130, the drain of a transistor 132 and the drain of a transistor 134. The transistors 128, 130 and 134 may be of the p-type and the transistor 132 may be of the n-type. The gates of the transistors 132 and 134 receive a timing signal on a line 136. The source of the transistor 134 has a positive voltage applied to it from the voltage source 60. The source of the transistor 132 is grounded as at 67.

The positive voltage from the voltage source 60 is also applied to the source of the transistor 128. The drain of the transistor 128 is common with the gate of a transistor 136 and the drain of a transistor 138. The transistor 136 may be of the p-type and the transistor 138 may be of the n-type. The gate and the source of the transistor 138 are respectively connected to the gate and drain of the transistor 121.

The source of the transistor 136 receives the positive voltage from the voltage source 60. The drain of the transistor 136 is common with the output line 82 (also shown in FIG. 3) and with the drain of a transistor 140. The source of the transistor 140 is grounded as at 67. The gate of the transistor 140 receives timing signals on a line 142.

In like manner, transistors 144, 146 and 148 are associated with the transistor 130 in a manner similar to the association of the transistors 136, 138 and 140 with the transistor 128. The drain of the transistor 104 is connected to the output line 96 also shown in FIG. 3. A timing signal on a line 150 is introduced to the gate of the transistor 148 in a manner similar to the introduction of the timing signal on the line 142 to the gate of the transistor 140.

The transistors 100 and 102 (FIG. 3) become simultaneously conductive in accordance with the introduction of timing signals to the gates of the transistors. When the transistor 100 is conductive, the variable input voltage on the line 104 is introduced through the transistor 100 to the gate of the transistor 50. Similarly, the reference voltage on the line 106 is introduced through the transistor 102 to the gate of the transistor 52.

The conductivity of the transistors 50 and 52 in the differential amplifier is dependent upon the magnitude of the voltages respectively introduced to the gates of the transistors. Dependent upon the magnitudes of these voltage, current flows through a first circuit including the voltage source 60, the transistor 54, the transistor 50 and the resistance 64 and a second circuit including the voltage source 60, the transistor 54, the transistor 52 and the resistance 68. Current is able to flow through these circuits because the transistor 54 is biased during this time to a state of conductivity by the voltage on the line 58. The currents through the resistances 64 and 68 produce across the resistances relative magnitudes of voltages related to the magnitudes of the voltages introduced to the gates of the transistors 50 and 52. These voltages are respectively introduced to the output lines 65 and 69.

At certain times, the timing signals on the gates of the transistors 100 and 102 may be discontinued and signals may be simultaneously introduced to the gates of the transistors 110 and 112 to make these transistors conductive. When the transistor 110 becomes conductive, it produces a short circuit between the gates of the transistors 50 and 52 At the same time, the shorting of the transistor 112 causes the reference voltage on the line 106 to be introduced through the transistor 112 to the gate of the transistor 50 and the gate of the transistor 52.

Since the reference voltage is simultaneously introduced to the gates of the transistors 50 and 52, equal voltages should theoretically be produced across the resistors 64 and 68. However, imbalances in the components of the differential amplifier including the resistances 64 and 68 and the transistors 50 and 52 cause an offset voltage to be produced in the differential amplifier. This offset voltage may occur as a result of differences in the characteristics of the transistors 50 and 52 and/or differences in the characteristics of the resistances 64 and 68. The offset voltage may vary with time because of changes in temperature or because of differences in the aging of the different elements in the differential amplifier. The offset voltage is indicated by a difference in the voltages across the resistances 64 and 68 when the transistors 110 and 112 are conductive.

During the production of the offset voltages on the output lines 65 and 69 in FIG. 3, the voltages on these lines are respectively introduced to the gates of the transistors 124 and 126 (FIG. 4) and the gates of the transistors 121 and 123 in FIG. 4. The voltages on the lines 65 and 69 are able to be introduced to the transistors 121, 123, 124 and 126 during the production of the offset voltages because the timing signals on the gates of the transistor 120 and a transistor 152 bias these transistors to a state of conductivity during this time.

When the voltages on the lines 65 and 69 are respectively introduced to the gates of the transistors 124 and 126 and the gates of the transistors 121 and 123, the voltages charge the distributed capacitances in the transistors. During this time, the transistor 132 is also closed. The conductivity of the transistor 132 during this period short the series branch represented by the transistors 121 and 123 and the series branch represented by the transistors 124 and 126. This prevents the voltages on the lines 65 and 69 from having any effect in producing voltages from the transistors 121, 123, 124 and 126.

The transistor 134 is non-conductive when the transistors 120, 152 and 132 are conductive. The non-conductivity of the transistor 134 further assures that the transistors 121, 123, 124 and 126 will not conduct current when the transistors 120, 154 and 132 are conductive. The reason is that the non-conductivity of the transistor 134 prevents an energizing voltage from being introduced to the transistors 121, 123, 124 and 126.

The transistors 120, 152 and 132 become simultaneously non-conductive in FIG. 4. Thus, when the input voltage on the line 104 is introduced to the transistor 50 and the reference voltage on the line 106 is introduced to the transistor 52, the charges in the distributed capacitances in the transistors 121 and 123 are effective in controlling the conductivity of these transistors. Similarly, the charges in the distributed capacitances in the transistors 124 and 126 are effective in controlling the conductivity of these transistors.

In like manner, the transistor 134 becomes conductive at the same time that the transistors 120, 152 and 132 become non-conductive. When the transistor 134 becomes conductive, the charges in the distributed capacitances of the transistors 121, 123, 124 and 126 become effective in controlling the conductivity of these transistors.

The transistors 121, 123, 124 and 126 operate as a latch in responding to the distributed capacitances in the transistors when the transistor 134 becomes conductive. For example, assume that the transistor 126 is more conductive than the transistor 123 at a particular instant and that the transistor 124 is less conductive than the transistor 121 at that instant. The resultant voltage produced in the drain of the transistor 124 and the drain of the transistor 126 is introduced to the gates of the transistors 121 and 123 to make the transistor 123 even less conductive and the transistor 121 more conductive. Similarly, the voltage on the drain of the transistor 121 and the drain of the transistor 23 is introduced to the gates of the transistors 124 and 126 to make the transistor 126 even more conductive and the transistor 124 less conductive. As a result, the latch formed by the transistors 121, 123, 124 and 126 operates in a state of either a binary "1" or a binary "0" dependent upon the relative magnitudes of the offset voltages on the lines 65 and 69.

The voltage produced on the drain of the transistor 124 and the drain of the transistor 126 during the conductivity of the transistor 134 is introduced to the gate of the transistor 138 to control the operation of the transistor. For example, when the transistor 124 is relatively more conductive than the transistor 121 (and the transistor 126 is less conductive than the transistor 123), the current path through the transistors 134 and 124 causes the voltage on the drain of the transistor 126 to be relatively high. The introduction of this voltage to the gate of the transistor 138 causes the transistor 138 to become increasingly conductive.

The increased conductivity of the transistor 138 tends to decrease the voltage across the transistor so that a decreased voltage is introduced to the gate of the transistor 136. The transistor 136 accordingly becomes increasingly conductive. As a result, the voltage on the drain of the transistor becomes increasingly positive so that a positive pulse is produced on the output line 82.

At the same time that a positive pulse is produced on the output line 82, a negative pulse is produced on the output line 96. This results from the fact that the increased conductivity of the transistors 123 and 124 produces an increase in the voltage on the drain of the transistor 126. This increased voltage produces a decrease in the current through the transistor 146 and a decrease in the current through the transistor 144. This produces a decrease in the voltage at the drain of the transistor 144 and on the output line 96.

The pulses on the lines 82 and 96 are respectively introduced to the transistors 77 and 90 in FIG. 3. Considering only the operation of the members associated with the transistor 77, the pulse on the line 82 passes through the transistor 77 in accordance with the timing signal applied to the line 80. This pulse charges the capacitance 78 relatively rapidly to a value dependent upon the magnitude of the pulse. The capacitance 78 is charged relatively rapidly because it has a relatively small value.

The timing signal on the line 76 occurs after the timing signal on the line 80 has ended. When the timing signal is produced on the line 76, the transistor 74 becomes conductive. The capacitance 78 accordingly discharges into the capacitance 70. The capacitance 78 stores this charge for a relatively long time because it has a relatively large value. The voltage across the capacitance 70 is introduced through the transistor 62 to the output line 65. In like manner, the capacitance 84 becomes charged to a value dependent upon the production of the pulses on the line 96. The resultant voltage across the capacitance 84 is introduced to the output line 69. This causes a correction to be made to the voltages produced on the lines 65 and 69 in accordance with the differences between the variable input voltage on the line 104 and the reference voltage on the line 106. The resultant voltages on the lines 65 and 69 accordingly provide an accurate indication of the differences between the input voltage on the line 104 and the reference voltage on the line 106 since a compensation has been provided for the offset voltages in the differential amplifier including the transistors 50 and 52.

Since the capacitance 70 has a relatively large value, it discharges relatively slowly. As a result, the charge on the capacitance is substantially constant between each pair of introductions of the reference voltage on the line 106 to the gate of the transistor 50. This provides for a substantially constant correction in the offset voltage during all of the time between one introduction, and the next introduction, of the reference voltage on the line 106 to the gate of the transistor 50.

As will be appreciated, the system of this invention provides corrections in the offset voltage on a binary basis. Each such correction involves a single binary bit. As a result, it may require several cycles of operation for the charges in the capacitances 70 and 84 to reach a level actually representing the offset voltage in the comparator. Thereafter, if the offset voltage remains substantially constant, the charges in the capacitances 70 and 84 may be increased by a binary increment of "1" in alternate cycles and may be decreased by a binary increment of "1" in the other cycles.

The invention described above has certain important advantages. After the first few cycles of operation, it provides an instantaneous compensation in the comparator for the offset voltage in the comparator. It provides the compensation over relatively long periods of time without affecting the speed of response of the comparator to differences between the variable input voltage and the offset voltage. It provides the offset voltage through a digital response and on a feedback basis. As a result, it has no effect on the variable input voltage and the reference voltage or on the introduction of these voltages to the comparator.

The invention also has other important advantages. It operates on a dynamic basis to provide the offset voltage. Actually, the operation to provide the offset voltage occurs on the same basis as the operation to provide the difference between the input and reference voltages. In this way, the invention provides a compensation for dynamic offsets as well as static offsets.

The invention also provides other important advantages. Since the large capacitances 70 and 84 are not in any series path to provide the compensation for the offset voltage, the offset compensation can be provided faster in this invention than in the prior art. Furthermore, the feedback path to provide the offset correction is different from the path for providing the differential between the input and reference voltages. This prevents the feedback path from interfering with the path for providing the data conversion.

As will be appreciated, a gain amplifier does not have to be included in this invention. This is in contrast to the prior art since gain amplifiers have generally had to be included in the prior art. As a result, the system of this invention can operate faster than the systems of the prior art.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing a correction in a comparator to compensate for an offset voltage produced in the comparator, an amplifier having a first input for a reference voltage and a second input for a variable voltage and having an output and having characteristics to produce the offset voltage, means for introducing the reference voltage to the first input, means for introducing the variable voltage to the second input to obtain the production in the amplifier of the offset voltage and a voltage representative of the difference between the variable and reference voltages, means for periodically shorting the first and second inputs to provide for the introduction of the reference voltage to both inputs, means for determining the offset voltage from the amplifier when the first and second inputs are shorted, and means for introducing the offset voltage to the output of the amplifier when the reference voltage is introduced to the first input and the variable voltage is introduced to the second input, the offset voltage being introduced to the output of the amplifier in a polarity for compensating for the offset voltage produced in the comparator.

2. In a combination as set forth in claim 1, latching means for storing the offset voltage produced by the amplifier when the first and second inputs are shifted, the means for introducing the offset voltage to the first and second inputs being responsive to the voltage stored in the latching means for introducing such stored voltage to the output of the amplifier when the reference voltage is introduced to the first input and the variable voltage is introduced to the second input.

3. In a combination as set forth in claim 2, means for preventing the latching means from being operative to receive the offset voltage when the reference voltage is introduced to the first input and the second input, and means for preventing the voltage in the latching means from being introduced to the output of the amplifier when the first and second inputs are shorted.

4. In a combination as set forth in claim 1, the means for determining the offset voltage being digitally operative.

5. In a combination as set forth in claim 3, the means for determining the offset voltage including first and second stages, the output of each stage being connected to the input of the other stage to provide a positive feedback, the inputs to the first and second stages being responsive to the voltages from the amplifier when the first and second inputs to the amplifier are shorted.

6. In combination for providing a correction in a comparator to compensate for an offset voltage produced in the comparator, an amplifier having first and second inputs and having first and second outputs and having characteristics to produce the offset voltage, means for introducing a reference voltage to the first input, means for introducing a variable voltage to the second input to obtain the production in the amplifier of the offset voltage and a voltage representative of the difference between the variable and reference voltages, means for periodically shorting the first and second inputs, means operative in accordance with the shorting of the first and second inputs for introducing the reference voltage to the first and second inputs to obtain on the first and second outputs a voltage difference corresponding to the offset voltage in the amplifier, means responsive to the voltage on the first and outputs in the shorted relationship of the first and second inputs for storing this voltage, and means for introducing the stored voltage to the first and second outputs, during the introduction of the reference voltage to the first input terminal and the introduction of the variable voltage to the second input terminal, in a polarity to compensate in the amplifier for the offset voltage produced in the amplifier.

7. In a combination as set forth in claim 6, the voltage-storing means including latching means having first and second operative states and responsive so the voltage from the first and second output terminals of the amplifier for operating in an individual one of the first and second states, the voltage-storing means further including means responsive to the state of operation of the latching means for storing energy in accordance with the state of operation of the latching means, and means responsive to the stored energy for introducing such energy as the stored voltage to the first and second outputs, during the introduction of the reference voltage to the first input and the introduction of the variable voltage to the second input, in a direction to compensate in the amplifier for the offset voltage produced in the amplifier.

8. In a combination as set forth in claim 7, the energy-storage means in the voltage-storing means including first storage means responsive to the first state of operation of the latching means for storing a charge and including second charge-storage means responsive to the second state of operation of the latching means for storing a charge.

9. In a combination as set forth in claim 8, means for obtaining an operation of the latching means, only during the introduction of the variable voltage to the first input and the introduction of the variable voltage to the second input, in the individual one of the first and second states, and means for providing for the introduction of the energy in the first and second charge-storage means to the first and second outputs only during the introduction of the reference voltage to the first input terminal and the variable voltage to the second input terminal.

10. In a combination as set forth in claim 9, the latching means having first and second stages each with an input terminal and n output terminal, the input terminal in each stage in the latching means being connected to the output terminal of the other stage in the latching means.

11. In combination for providing a correction in a comparator to compensate for an offset voltage produced in the comparator, means for providing a signal producing a horizontal scan and a retrace of the horizontal scan, an amplifier having first and second inputs and having first and second outputs and having characteristics to produce the offset voltage, means for introducing a reference voltage to the first input, means for introducing a variable voltage to the second input during the horizontal scan to obtain the production by the amplifier on the first and second outputs of a signal representing the offset voltage and the difference between the variable and reference voltages, means for providing for the introduction of the reference voltage to the second input terminal during the retrace to provide for the production of the offset voltage during the retrace, and means for introducing the offset voltage from the last mentioned means to the first and second outputs during the horizontal scan in a direction to compensate for the offset voltage produced in the amplifier during the horizontal scan.

12. In a combination as set forth in claim 11, latch means for storing, during each horizontal scan, the offset voltage produced during the previous retrace to provide for the introduction of such stored voltage to the first and second outputs during such horizontal scan.

13. In a combination as set forth in claim 11, switching means having first and second states of operation and operative in the first state to provide for the introduction of the variable voltage to the first input and operative in the second state to provide for the introduction of the reference voltage to the first input, and means operatively coupled to the switching means to provide for the operation of the switching means in the first state during the horizontal scan and for the operation of the switching means in the second state during the horizontal retrace.

14. In a combination as set forth in claim 12, switching means having first and second states of operation and operative in the first state to provide for the introduction of the offset voltage to the first and second outputs and operative in the second state to prevent the introduction of the offset voltage to the first and second outputs, and means operatively coupled to the switching means for providing an operation of the switching means in the first state during the horizontal scan and an operation of the switching means in the second state during the horizontal retrace.

15. In combination for providing a correction in a comparator to compensate for an offset voltage produced in the comparator, means for providing on a recurrent basis for the generation of information during first time periods and for providing for blanking of such information during second time periods alternating with the first time periods, an amplifier having first and second inputs and first and second outputs and having characteristics to produce the offset voltage, means for introducing a reference voltage to the first input, means for introducing a variable voltage to the second input during the first time periods to obtain the production on the first and second outputs of the offset voltage and a voltage representing the difference between the reference and variable voltages, means for introducing the reference voltage to the second input terminal during the second time periods to obtain the production of the offset voltage in the amplifier, and means for introducing the offset voltage to the first and second outputs during the first time periods in a direction to compensate in the first and second outputs for such offset voltage produced in the amplifier.

16. In a combination as set forth in claim 15, means for storing, during each of the first time periods, the offset voltage produced during each of the preceding second time periods, the storing means being included in the means for introducing the offset voltage to the first and second outputs during the first time period.

17. In combination for providing a correction to compensate for an offset voltage, an amplifier having characteristics for producing the offset voltage, means for periodically introducing an input signal to the amplifier in first time periods to obtain an output from the amplifier corresponding to the offset voltage and the input to the amplifier, means for periodically shorting the amplifier, in second time periods different from the first time periods, to obtain the production of the offset voltage in the amplifier, and means for periodically introducing the offset voltage to the output from the amplifier in the first time periods in a polarity to compensate for the offset voltage produced in the amplifier.

18. In a combination as set forth in claim 17, means for storing in the first time periods a charge corresponding to the offset voltage, the compensating means being responsive to the stored charge to introduce the compensating voltage to the output from the amplifier.

19. In a combination as set forth in claim 18, means for periodically adjusting the stored energy in the first time periods in accordance with the offset voltage produced at the output from the amplifier the second time periods.

20. In a combination as set forth in claim 19, the adjusting means being digitally operative in the first time periods to produce binary signals in accordance with the polarity and magnitude of the offset voltage produced in the amplifier in the second time periods, and the storing means being responsive to the binary signals for adjusting the stored charge in the first time periods in accordance with such binary signals.

21. In a combination as set forth in claim 20, means for preventing the stored charge from being introduced to the output from the amplifier in the second time periods.

22. In combination for providing a correction to compensate for an offset voltage, an amplifier having an input and an output and having characteristics to produce the offset voltage, means for periodically introducing an input signal to the input of the amplifier during first time periods to obtain an output from the amplifier corresponding to the offset voltage and the input, means for periodically shorting the input, at second times different from the first times, to obtain from the amplifier a digital output representing the offset in the amplifier, storage means, means for providing an accumulation of energy in the storage means in accordance with the digital outputs from the amplifier in the successive ones of the second time periods, and means for introducing the energy from the storage means to the output of the amplifier in the successive ones of the first time periods to compensate for the offset voltage produced in the amplifier.

23. In a combination as set forth in claim 22, means for providing a reference voltage, the amplifier being periodically responsive to the difference between the input and reference voltages in the first time periods to provide the output from the amplifier in accordance with such difference, the shorting means being operative to apply the reference voltage to the input to the amplifier in the second time periods.

24. In a combination as set forth in claim 23, means for preventing the energy from the storage means from being introduced to the output of the amplifier in the second time periods, and means for preventing the output from the amplifier from being introduced to the storage means in the second time periods.

25. In a combination as set forth in claim 1, the amplifier being a differential amplifier.

26. In a combination as set forth in claim 7, the amplifier being a differential amplifier.

27. In a combination as set forth in claim 11, the amplifier being a differential being a differential amplifier.

28. In a combination as set forth in claim 16, the amplifier being a differential amplifier.

29. In a combination as set forth in claim 18, the amplifier being a differential amplifier.

30. In a combination as set forth in claim 22, the amplifier being a differential amplifier.

* * * * *